United States Patent
Barankova et al.

(10) Patent No.: US 6,351,075 B1
(45) Date of Patent: Feb. 26, 2002

(54) PLASMA PROCESSING APPARATUS HAVING ROTATING MAGNETS

(76) Inventors: Hana Barankova; Ladislav Bardos, both of Ullerakersvagen 64, 756 43 Uppsala (SE)

(*) Notice: Subject to any disclaimer, the term of this patent is extended or adjusted under 35 U.S.C. 154(b) by 0 days.

(21) Appl. No.: 09/554,666
(22) PCT Filed: Nov. 3, 1998
(86) PCT No.: PCT/SE98/01983
    § 371 Date: Aug. 8, 2000
    § 102(e) Date: Aug. 8, 2000
(87) PCT Pub. No.: WO99/27758
    PCT Pub. Date: Jun. 3, 1999

(30) Foreign Application Priority Data

Nov. 20, 1997  (SE) .............................................. 9704260

(51) Int. Cl.⁷ ................................................ H01J 7/24
(52) U.S. Cl. .............................. 315/111.71; 315/111.41; 315/111.21; 118/723 MA; 118/723 MR
(58) Field of Search ........................ 315/111.71, 111.21, 315/111.41, 111.61; 118/723 MA, 723 MR (56) References Cited

U.S. PATENT DOCUMENTS

| 5,411,624 | A | * | 5/1995 | Hirano et al. | ................ 156/345 |
| 5,449,977 | A | * | 9/1995 | Nakagawa et al. | ..... 315/111.51 |
| 5,518,547 | A | * | 5/1996 | Barnes et al. | ......... 118/723 MA |
| 5,717,294 | A | * | 2/1998 | Sakai et al. | ............. 315/111.41 |

FOREIGN PATENT DOCUMENTS

| JP | 2-246216 | 10/1990 |
| JP | 6-212420 | 8/1994 |
| JP | 6-224027 | 8/1994 |
| JP | 6-283474 | 10/1994 |
| SE | 503141 | 4/1996 |

* cited by examiner

*Primary Examiner*—Don Wong
*Assistant Examiner*—Tuyet T. Vo
(74) *Attorney, Agent, or Firm*—Young & Thompson (57) ABSTRACT

A plasma processing apparatus includes at least one pair of a first rotary permanent magnet system (1) and a second rotary permanent magnet system (2) The rotary permanent magnet systems further include individual permanent magnets (3) and are positioned opposite to each other. The individual permanent magnets (3) have a maximum magnetic induction of more than $10^{-1}$ Tesla. Additionally a driver system (4) for driving a motion of the rotary magnet systems (1, 2) is used in combination with a basic plasma processing device (5). By means of the rotary permanent magnet systems time variable magnetic flux lines (6) will be formed for affecting the plasma (7) produced by the plasma processing device (5). The apparatus additionally utilizes a control system (11) comprising a sensor system (12) and a feedback system (13) connected to the driver system for controlling motion of the permanent magnets of the rotary permanent magnet systems with respect to changes in the plasma produced by the basic plasma processing device (5).

28 Claims, 9 Drawing Sheets

EXAMPLE 1

FIG.6

EXAMPLE 2

FIG.7

EXAMPLE 3

FIG.8

EXAMPLE 4

FIG. 9

EXAMPLE 5

PLASMA PROCESSING APPARATUS HAVING ROTATING MAGNETS

FIELD OF THE INVENTION

The present invention relates to a plasma processing apparatus using rotary magnets, particularly for arc discharge processing and for magnetron sputter deposition or etching processes.

BACKGROUND

High density plasma sources and devices for low pressure plasma processing of surfaces utilize auxiliary magnetic fields. Obviously the magnetic field can be used for magnetic confinement of plasma electrons and ions. The Lorentz force vector F affecting the motions of charged particles is defined as:

$$F=q(v \times B),$$

where v is the velocity vector of a charged particle (electron or ion) having charge $q_{e,i}$, and B is the vector of magnetic induction. The Lorentz force acts on electrons and ions having non-zero vector product ($v \times B$), i.e. having a velocity component $V_{norm\,(e,i)}$ normal to the vector B. These electrons and ions (of the mass $m_{e,i}$) are forced to gyrate around the magnetic flux lines at Larmor radii defined as $$r_{e,i}=V_{norm(e,i)} m_{e,i}/q_{e,i}B.$$

The most typical driving force for charged particles is the electric field (vector E). In this case the resulting flows of particles have a direction (drift) given by the vector product ($E \times B$). Note that the higher the particle velocity (energy) is, which depends on the field E, on collisions, etc., the higher the magnetic induction B must be to maintain the same Larmor radius. The higher the induction B is the lower Larmor radius of particles. These relations are very important, because the magnetic confinement can be effective only in cases where the reactor chamber dimensions are larger than the Larmor radii of particles. Otherwise the particles recombine at the chamber walls. In strong magnetic fields the Larmor radii are short and the plasma can be confined in small volumes. Due to reduced recombination losses the magnetic confinement leads to more dense plasmas compared with cases without magnetic means. At low gas pressures where the collisions between particles are less frequent the mean free paths of particles usually are longer than the dimensions of reactor chambers. The particles can gain high energy from generating fields and the wall recombination rate can prevail ionization. Such a plasma can not sustain without an additional magnetic confinement.

A magnetic field can be used also as an active component in different mechanisms of plasma generation. For example in electron and ion cyclotron resonances (ECR, ICR) where magnetic induction B relates to both the generator frequency as and the electron or ion mass:

$$B=\omega m_{e,i}/q_{e,i}.$$

Other examples are hybrid resonances, Landau damping-assisted heating of the plasma, etc. At both an optimal value of the magnetic induction and an optimal shape of the magnetic flux the resonant generation of the high density plasma can be combined with its confinement in a defined volume.

A wide variety of magnetic confinements (plasma traps) for the radio frequency (RF) glow discharges using static magnetic fields generated by electromagnetic coils were patented by A. S. Penfold and J. A. Thornton (U.S. Pat. No. 4,116,794 dated 26-09-1978). The patent introduces different arrangements of magnetic coils optimized for different geometries of RF electrodes. The aim of this optimization is to maximize the confinement of the discharge and its sustainment down to low gas pressures in the discharge chamber. All the coil arrangements claimed are static both in time and space.

It is also possible to "move" the magnetic field in the space either by moving, the magnetic coil itself or step-by-step switching on the current to coils, configuring an array of coils. For example the moving-coil magnetic field was used in the microwave ECR discharges (R. Hytry et al., J. Vac. Sci. Technol., 1993). The periodic replacement of the field in a static system of electromagnets by successive shifting of the generation current in the respective coils was reported in an inductive RF discharge by M. Murata et at. (Vacuum 1997). These movements of the magnetic field are based on spatial replacement of the magnetic means without change of shapes of magnetic flux lines and field geometry.

Generally the design of proper shape of the magnetic field with electromagnetic coils is impossible in cases when high magnetic induction is required in small volumes or restricted areas. Regarding these problems 1984 was a year of breakthrough when a discovery was made on strong permanent magnets based on ternary inter-metallic compounds, e.g., Nd—Fe—B (e.g. see book "Ferromagnetic materials" by E. P. Wohlfarth and K. H. J. Buschow, North-Holland 1988, Chapter 1, FIG. 1 p.4 and p.7). This kind of magnets can provide a very strong magnetic field (more than 0.1 T at the magnet surface). In many practical cases these magnets successfully replace electromagnetic coils and allow magnetic field applications with well defined shapes in a selected space. The most important possibility is forming of intense local magnetic fields with a proper design of magnetic flux lines, which is not practically possible with coils.

A local magnetic field was used in apparatus for generation of a linear arc discharge for plasma processing (LAD) by L. Bardos and H. Barankova (Swedish patent publication SE 503 141, Nov. 1994), particularly for processing on surfaces of solid substrates. In this apparatus a pair of electrode plates placed opposite to each other and connected to the same pole of the generator are positioned in a magnetic field produced by magnets for development of linear hot zones on the electrode plates where an arc discharge is generated. The electrode plates form a parallel-plate hollow cathode, negative with respect to the surrounding plasma, which represents a virtual anode. The hot zones are formed due to an ion bombardment of the plate surfaces in the hollow cathode discharge between the plates. The magnetic field perpendicular to the cathode plates in this apparatus facilitates the hollow cathode discharge in the slit between the plates. The position of magnets can be tuned with respect to the electrode plates by a tuner and the distribution of the magnetic field is tuned by magnets and by additional magnets. Thus, the magnetic field used in the LAD source is stationary both in space and time. For selected parameters of gas flow rate, generation power, gas pressure etc., the magnetic field can be tuned and optimized for uniform distribution of the resulting plasma density along the slit. However, due to non-zero v×B force in many practical applications the ions tend to concentrate more at one side of the hollow cathode slit. Time dependent changes of discharge parameters during operation of LAD source can cause changes of both the particle velocities and distribution of electric fields in the discharge. This can result in a non-uniform erosion of the cathode material by the arc sputtering and/or evaporation and consequently in a non-uniform processing rate on the substrates.

Another example of utilization of strong permanent magnets is the well-known magnetron sputtering/sputter etching device. Principles and performances of different magnetron systems for sputter etching/deposition processes are described in a number of works. Regardless of both their almost "classical" concept and their commercial availability since 1976, the magnetrons still undergo construction changes. Reasons for this are either an unsatisfactory plasma density at the substrate for selected applications or ineffective and non-uniform magnetron target utilization accompanied by a small erosion area on the target during sputtering. The former problem can be solved partly by "unbalancing" (opening) of the magnetic flux lines which allows an expansion of the plasma towards the substrate (B. Window and N. Savvides in 1986), or by an additional ionization tool, for instance by a hollow cathode (J. J. Cuomo et aL, U.S. Pat. No. 4,588,490 filed 22-05-1985), alternatively by an auxiliary RF coil (S. M. Rossnagel and J. Hopwood, Appl. Phys. Lett., 1993). The later problem is reduced in magnetrons with a rotatable cylindrical target "C-Mag" (M. Wright et al, J. Vac. Sci. Technol., 1986; A. Belkind et al., Thin Solid Films 1991) and in hollow target magnetrons (disclosed in U.S. Pat. No. 5,073,245 by V. L. Hedgcoth, 1991). A movement of the target with respect to the magnetic field can be substituted by a shifting of the magnetic field under the target. This is described in European Patent Application EP-B1-0 603 587 (Balzers AG, 1992), in which the system of permanent magnets, forming a tunnel-like magnetic field, is being laterally displaced under the target. The magnet poles can be pivoted and synchronized with the lateral shift to extend the lateral displacement of the tunnel-like field thereby to enlarge the erosion of the target. Another solution is based on new designs of magnetic fields using permanent magnets as disclosed in U.S. Pat. No. 5,262,028 by Sierra Applied Sciences, Inc. A review about different arrangements of magnetic fields in all known magnetrons was presented for example by J. Musil et al. (Vacuum, 1995) or by R. Kukla (Surf. Coat. Technol., 1997). In all the magnetrons either the stationary magnetic field is used (closed or unbalanced) or the field is moving during the processing with respect to the target (e.g. C-Mag), but without substantial change of its shape. The sputtering regimes are therefore "prescribed".

SUMMARY

An object of present invention is therefore to overcome the drawbacks of the above described prior art techniques and to provide a plasma processing apparatus with rotary magnets for obtaining an adjustable time variable magnetic field.

In a first aspect according to the present invention, a plasma processing apparatus comprising means for generating a plasma discharge, and means for confining the plasma in a magnetic field, comprises at least one pair of a first rotary permanent magnet system and a second rotary permanent magnet system placed opposite to each other, comprising individual permanent magnets having maximum magnetic induction more than $10^{-1}$ Tesla, a driver system disposed for the driving motion of said rotary permanent magnet systems, a basic plasma processing device used in combination with said rotary permanent magnet systems to form time variable magnetic flux lines and to affect a plasma produced by said basic plasma processing device, and a control system comprising a sensor system and a feedback system connected to said driver system, disposed for control of motions of said rotary permanent magnet systems with respect to changes of said plasma.

In a second aspect according to the present invention a plasma processing apparatus, comprising means for generating a plasma discharge, and means for confining the plasma in a magnetic field, comprises at least one pair of a first rotary permanent magnet system and a second rotary permanent magnet system placed opposite to each other, comprising individual permanent magnets having maximum magnetic induction more than $10^{-1}$ Tesla, a driver system disposed for the driving motion of said rotary permanent magnet systems, a basic plasma processing device comprising a linear arc discharge apparatus with at least one pair of hollow cathode plates placed in a magnetic field where stationary magnetic flux lines are either replaced or affected by time variable magnetic flux lines produced by said rotary permanent magnet systems for generation of a time dependent hollow cathode plasma, and a control system comprising a sensor system and a feedback system in connection with said driver system disposed for control of motions of said rotary permanent magnet systems with respect to changes of said time dependent hollow cathode plasma.

In a third aspect according to the present invention the basic plasma processing device comprises a magnetron device having a stationary magnet system, wherein the rotary permanent magnet systems are disposed to form time variable magnetic flux lines which traverse a magnetron target for generation of a time dependent magnetron plasma.

In a fourth aspect according to the present invention the basic plasma processing device comprises a magnetron device with rotatable magnetron target wherein said rotary permanent magnet systems are installed on a holder together with the stationary magnet system.

In a fifth aspect according to the present invention the basic plasma processing device comprises an active plasma in a reactor, where the rotary permanent magnet systems are disposed outside and/or inside the reactor to form time variable magnetic flux lines and to generate time dependent dense plasma regions.

In a sixth aspect according to the present invention said rotary permanent magnet systems comprise individual permanent magnets having different maximum magnetic inductions and/or different directions of magnetic flux lines.

In a seventh aspect according to the present invention said driver system controlled by the control system enables driving of the rotary permanent magnet systems in a step-wise motion or a vibrational motion around selected positions.

BRIEF DESCRIPTION OF THE DRAWINGS

The objects, features and advantages of the present invention as indicated above will become apparent from the description of the invention given in conjunction with the appended drawings, wherein.

DETAILED DESCRIPTION

Figure 1:
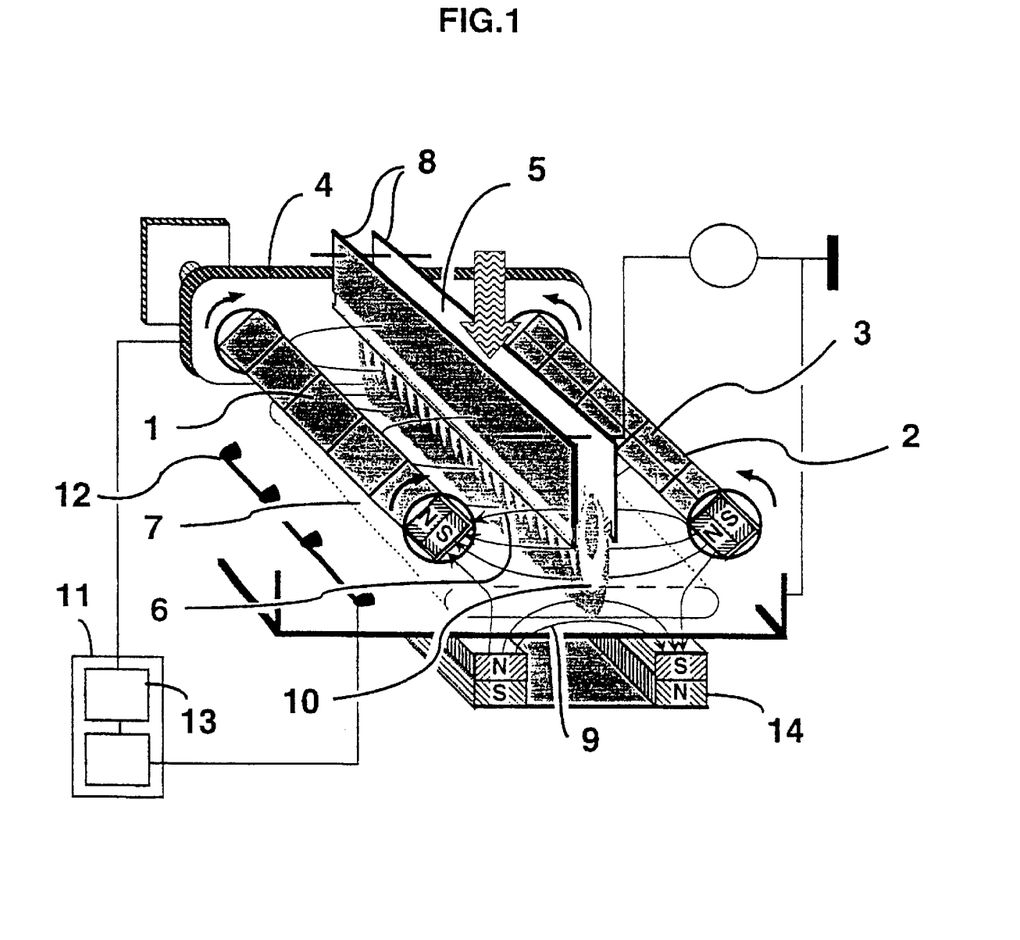
FIG. 1 is a schematic view of a first embodiment according to the present invention showing an example of a plasma processing apparatus with rotary magnets, for a linear arc discharge (LAD) processing in a time dependent hollow cathode plasma.

Referring to FIG. 1, a first embodiment of a plasma processing apparatus with rotary magnets according to the present invention will be described. At least one pair of a first rotary permanent magnet system 1 and a second rotary permanent magnet system 2 comprising individual permanent magnets 3 are placed opposite to each other. To provide a sufficient magnetic flux across a space between the rotary permanent magnet systems the individual permanent magnets should have their maximum magnetic induction higher than $10^{-1}$ Tesla (1000 Gauss). Strong NdFeB permanent magnets presenting surface induction up to about 0.5 Tesla or even more are suitable for this purpose. The rotary permanent magnet systems are driven by a driver system 4 performing, for instance, rotation of the rotary permanent magnet systems in opposite directions with respect to each other. The rotary permanent magnet systems are used in combination with a basic plasma processing device 5, for instance, with a linear arc discharge (LAD) apparatus, demonstrated in FIG. 1 as a first embodiment of the present invention. Motions of the rotary permanent magnet systems make both the distribution of the magnetic flux and the value of magnetic induction in a space between rotary permanent magnet systems being variable in time. Time dependent magnetic flux lines 6 affect a plasma 7 produced by the basic plasma processing device. In case of a LAD apparatus static permanent magnets creating magnetic field across the slit between hollow cathode plates 8 can be favorably replaced by the rotary permanent magnet systems. In this case formation of linear hot zones on the electrode plates of the LAD apparatus is dependent on changes of the magnetic flux lines 6 and a time dependent hollow cathode plasma 10 is generated. Moreover stationary magnetic flux lines 9 produced by a stationary magnet system 14 are also affected by the rotary permanent magnet systems. This influence results in time dependent changes of plasma produced by the apparatus. In a simplest case a steady spinning of rotary permanent magnet systems causes a symmetrization of the hollow cathode plasma density along the hollow cathode slit, independently on experimental parameter changes e.g., gas flow, gas pressure, power, etc. The spinning frequency of the rotary permanent magnets represents a new process control parameter not available in the static field LAD devices. The rotary permanent magnet systems can be driven also in a step-wise motion or in a vibrational mode of operation around selected positions. These motions can be favorably used for automatic control of selected parameters e.g., plasma parameters, by means of a control system 11 comprising a sensor system 12 for detection of selected parameters and a feedback system 13 for controlling the driver system 4. Such closed loop controllers response to changes of plasma parameters and make the driver system to change position of the rotary permanent magnets, thereby returning the parameters back to preselected values.

Figure 2:
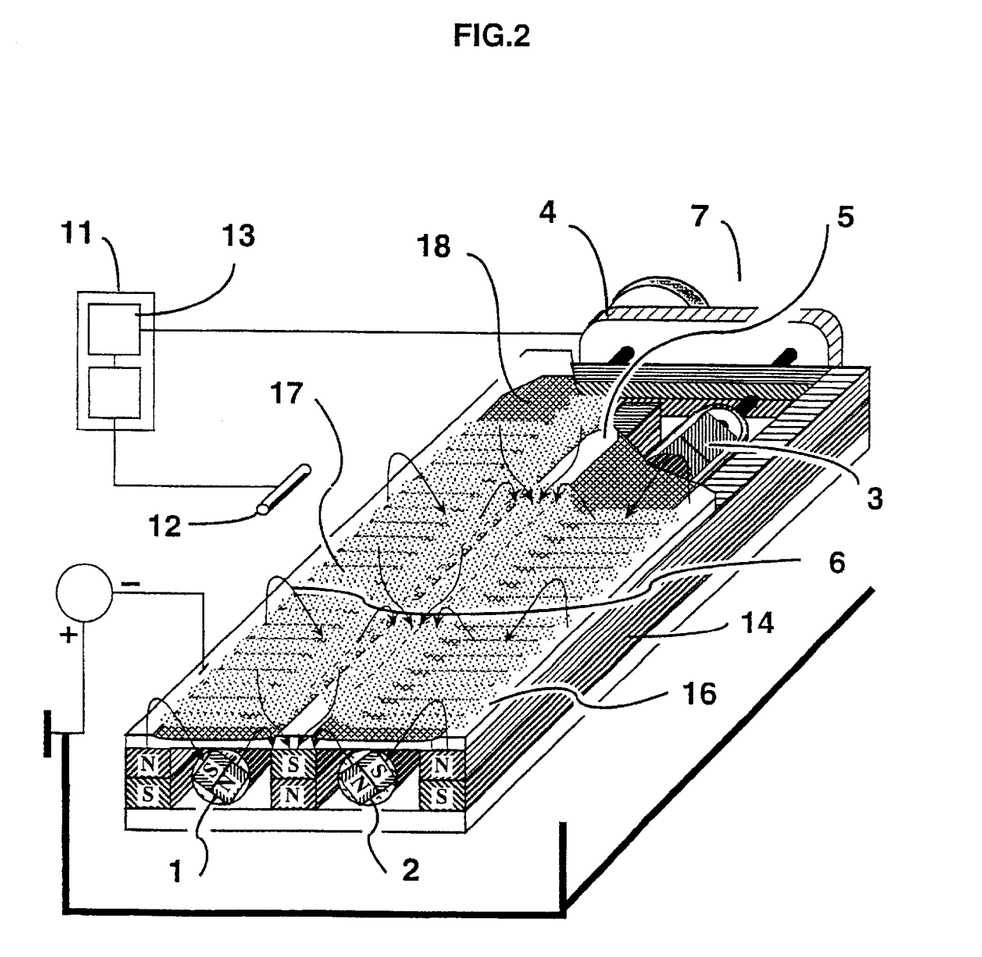
FIG. 2 is a schematic view of a second embodiment according to the present invention showing another example of a plasma processing apparatus with rotary magnets in combination with a magnetron device for generation of a time dependent magnetron plasma.

Referring to FIG. 2, a second embodiment of a plasma processing apparatus, having rotary magnets according to the present invention will be described in a schematic view. A pair of a first rotary permanent magnet system 1 and a second rotary permanent magnet system 2 comprising individual permanent magnets 3 are placed opposite to each other. Individual permanent magnets have a maximum magnetic induction of more than $10^{-1}$ Tesla (1000 Gauss). The rotary permanent magnet systems are driven by a driver system 4 performing, for instance, rotation of the rotary permanent magnet systems in opposite directions with respect to each other. The rotary permanent magnet systems are used in combination with a basic plasma processing device 5 which, in a second embodiment of the present invention, represents a magnetron device having a stationary magnet system 14. Motions of the rotary permanent magnet systems change the magnetic field of the stationary magnet system and make both the distribution of the magnetic flux and the value of magnetic induction at a magnetron target 16 time dependent. Time variable magnetic flux lines 6 cause a time dependent magnetron plasma 17, both in shape and in parameters. This time dependence results in a time dependent erosion of the target in an erosion zone 18. The erosion zone can be enlarged and, moreover, the magnetron can be periodically unbalanced and balanced, depending on arrangement of the rotary permanent magnet systems within the stationary magnet system of the magnetron. Control of the plasma parameters and/or erosion of the target is enabled by a control system 11 comprising a sensor system 12 and a feedback system 13 connected with the driver system.

Figure 3:
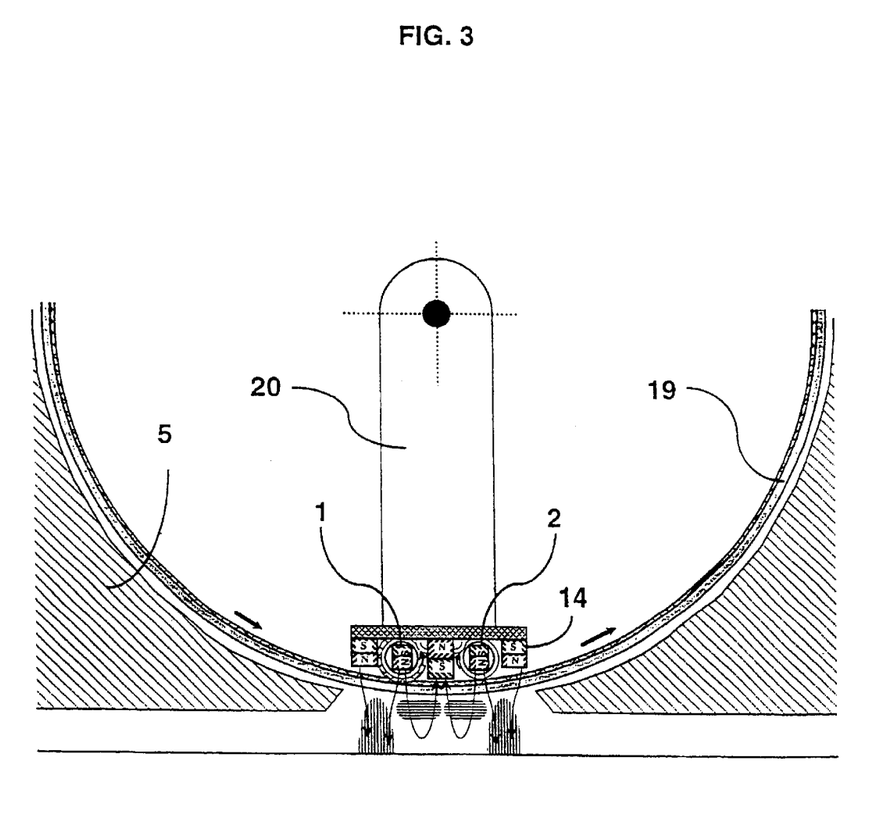
FIG. 3 is a schematic view of a third embodiment according to the present invention showing a further example of a plasma processing apparatus with rotary magnets installed in a magnetron device with rotatable target for generation of a time dependent magnetron plasma.

Referring to FIG. 3, a third embodiment of a plasma processing apparatus with rotary magnets according to the present invention will be described in a. schematic view. A pair of a first rotary permanent magnet system 1 and a second rotary permanent magnet system 2 placed opposite to each other is used in combination with a basic plasma processing device 5 which, in a third embodiment of the present invention, is a magnetron with a rotatable, magnetron target 119. Rotary permanent magnet systems are installed on a holder 20 together with a stationary magnet system 14. The rotary permanent magnet systems affect the magnetic field of the stationary magnet system and make both the distribution of the magnetic flux and the value of magnetic induction at the rotatable magnetron target time dependent. In cases when a simple rotation of the rotary permanent magnet systems is to be used, it is also possible to omit the driver system and to rotate the permanent magnet system by the rotatable magnetron target itself. The rotary permanent magnet systems permit magnetron operation in both an unbalanced and a closed-field regime simultaneously with changing their location in respect to the target. This is a unique ability impossible in conventional magnetrons.

Figure 4:
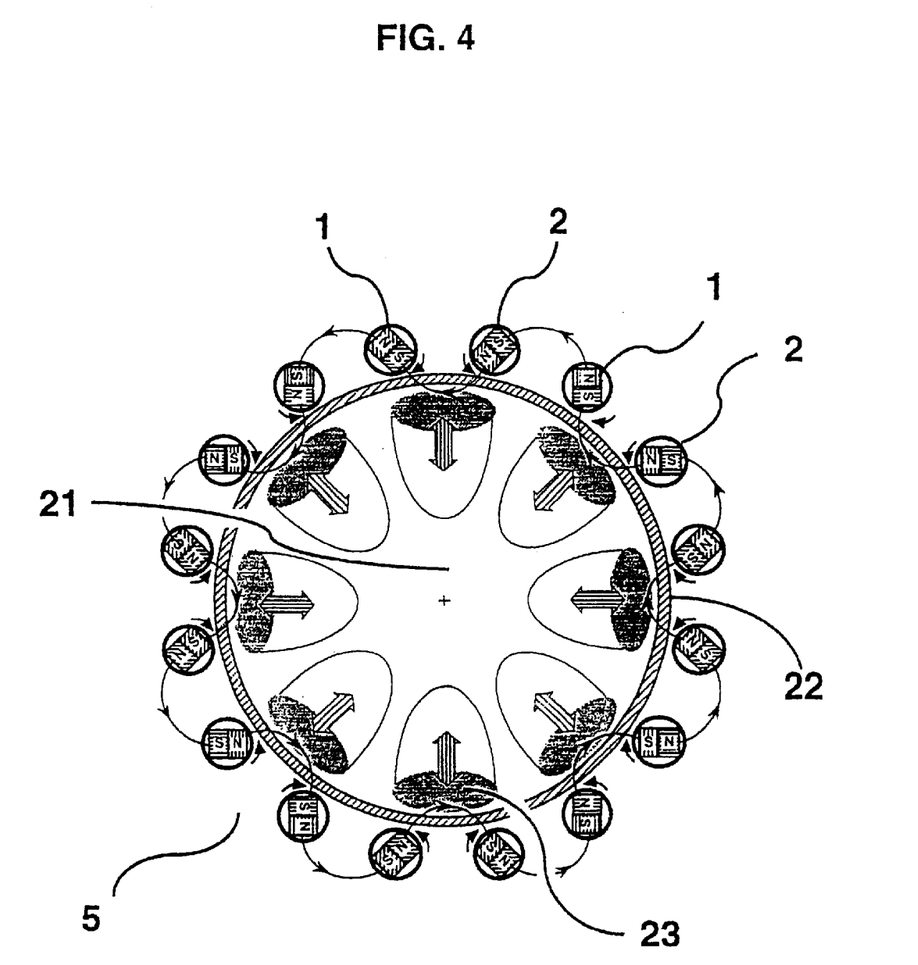
FIG. 4 is a schematic view of a fourth embodiment according to the present invention showing another further example of a plasma processing apparatus with rotary magnets in a reactor with an active plasma for generation of a time dependent dense plasma regions.

Referring to FIG. 4, a fourth embodiment of a plasma processing apparatus with rotary magnets according to the present invention will be described. Several pairs of a first rotary permanent magnet system 1 and a second rotary permanent magnet system 2 placed opposite to each other are disposed in a basic plasma processing device 5 which, in a fourth embodiment of the present invention, represents an active plasma 21 in a reactor 22. The pairs of rotary permanent magnet systems can be disposed outside and/or inside the reactor. Motions of rotary permanent magnet systems, for instance a simple rotation as illustrated in FIG. 4, cause periodic changes in plasma confinement, which results in formation of time dependent dense plasma regions 23. Time dependent changes of the plasma density, for instance a pulsation, can be correlated with other parameters, e.g., a pulsed inflow of gas reactants, a pulsed generation of the plasma, etc. Plasma processing regimes of this kind can be very important in a number of applications, for instance when a time dependent interaction of the plasma with substrate surfaces is required for interrupted depositions, low temperature treatments, etc.

EXAMPLES

Figure 5:
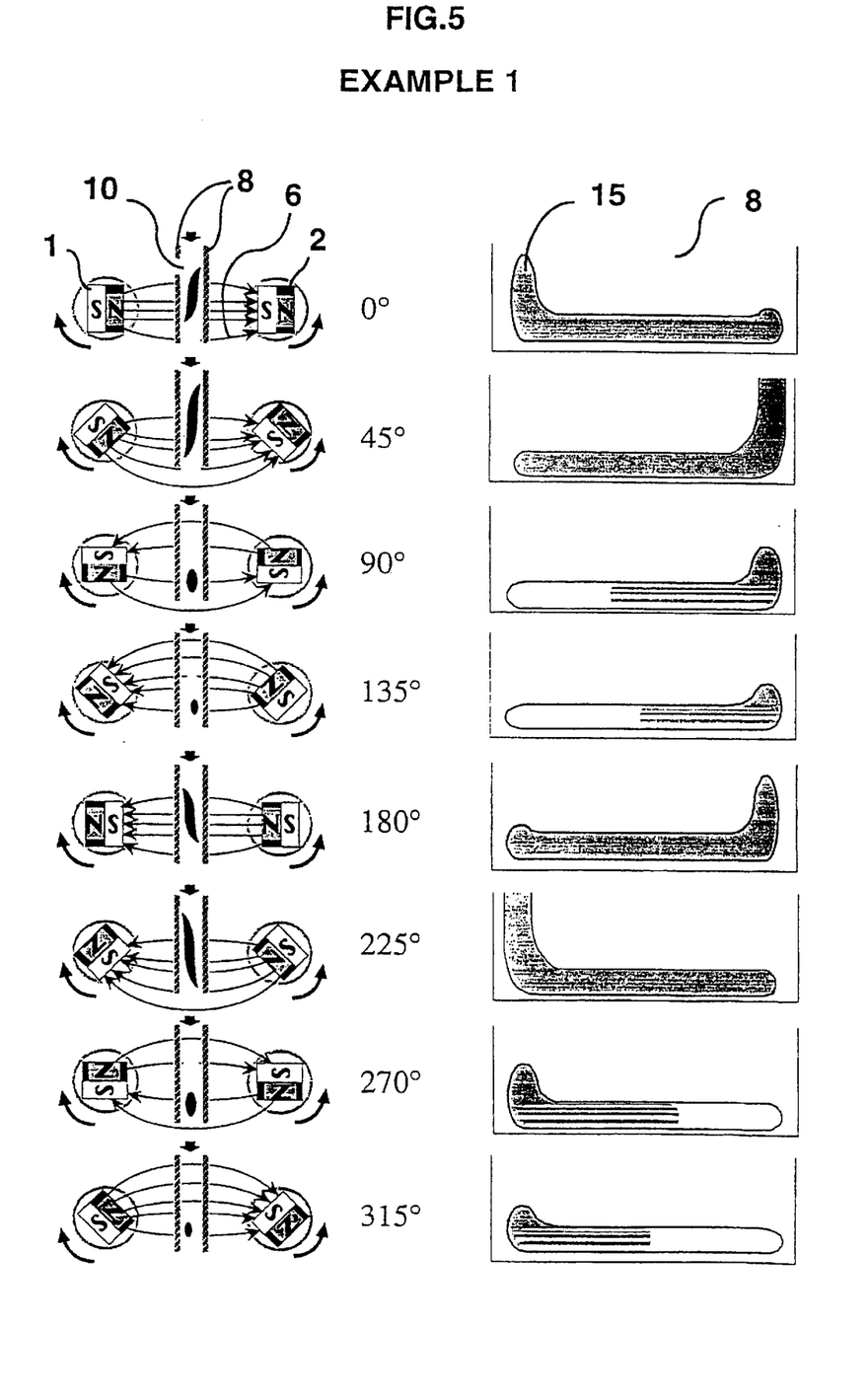
FIG. 5 shows an example of a plasma processing apparatus with rotary magnets according to a first embodiment of the present invention, for sequential 45° position changes from 0° to 315° of the rotary permanent magnet systems, an effect on distribution of magnetic flux lines, on distribution of a plasma, and on distribution of a hot zone at electrode plates, respectively, in a hollow cathode discharge generated by the apparatus shown in FIG. 1.

Referring to FIG. 5 a first example, related to a first embodiment of the plasma processing apparatus shown in FIG. 1, will be described. A schematic figure shows a cross-sectional view of rotary permanent magnet systems 1 and 2 al. different angular positions with respect to hollow cathode plates 8, in this case sequential 45° changes from 0° to 315°, and corresponding side view of an electrode plate 8. Time variable angular position of the rotary permanent magnet systems causes time variable shapes of the magnetic flux lines 6 between the rotary permanent magnet systems and consequently a time dependent shape of hollow cathode discharge 10. Changes in the hollow cathode discharge are followed by changes in parameters of hot zones 15 at the cathode plates 8, where an enhanced ion bombardment, thermionic and secondary emission of electrons as well as an enhanced erosion of the cathode plate material take place. A motion of the rotary permanent magnet systems, for instance simple rotation, favorably averages temperature distribution along the hot zones and consequently the resulting uniformity of plasma processing along the hollow cathode.

Figure 6:
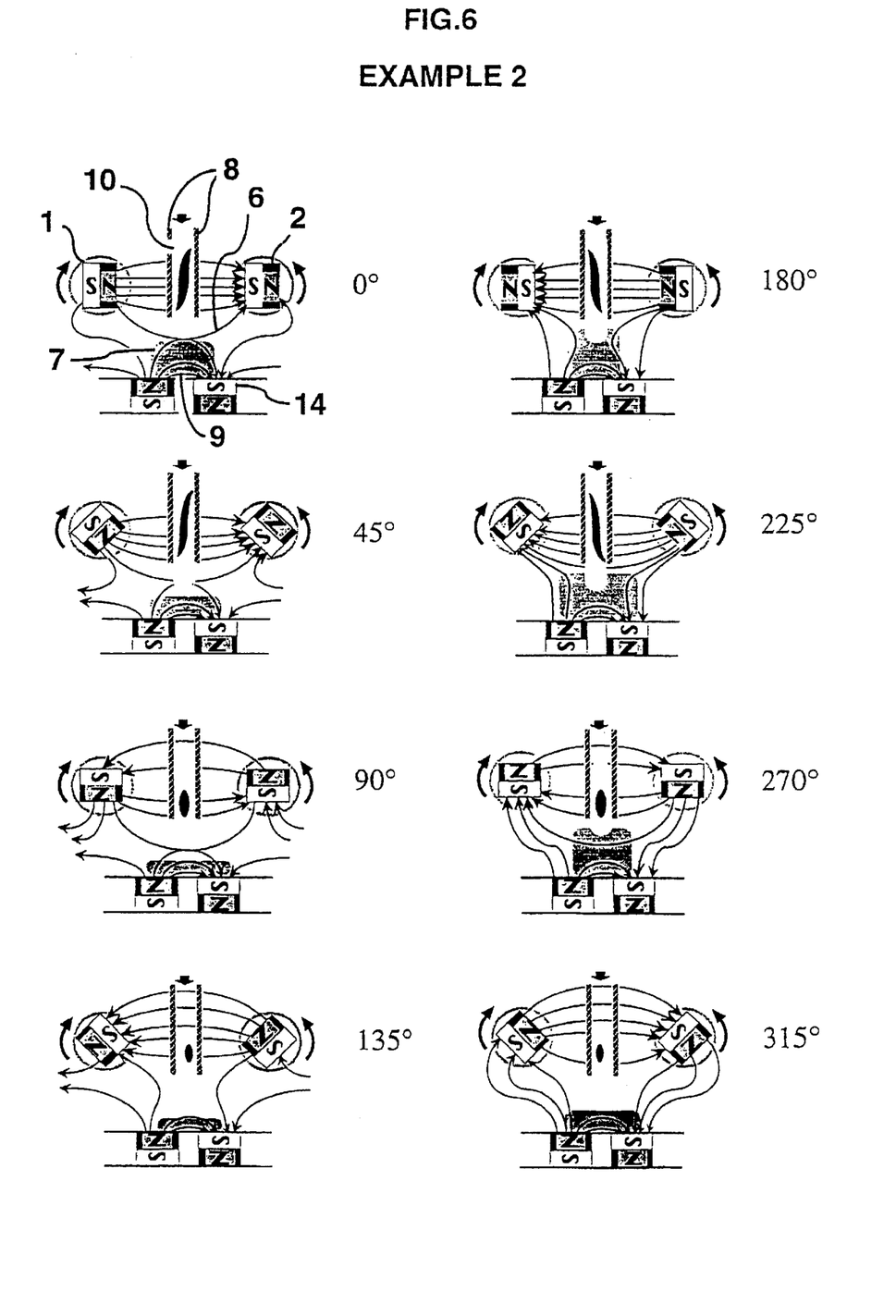
FIG. 6 shows an example of a plasma processing apparatus with rotary magnets according to the present invention in its first embodiment, for sequential 45° position changes from 0° to 315° of the rotary permanent magnet systems, an effect on the distribution of magnetic flux lines and magnetic flux lines produced by a stationary magnet system, and on a plasma distribution, respectively.

Referring to FIG. 6 a second example, related to a first embodiment of the plasma processing apparatus shown in FIG. 1, will be described. A schematic figure shows cross-sectional view of rotary permanent magnet systems 1 and 2 at different angular positions with respect to hollow cathode plates 8, in this case sequential 45° changes from 0° to 315°, and to a stationary magnet system 14. Time variable angular position of the rotary permanent magnet systems causes time variable shapes of the magnetic flux lines 6 between the rotary permanent magnet systems and this also affects stationary magnetic flux lines 9. It results in time dependent shapes of both a hollow cathode discharge 10 and a plasma 7 produced by the device.

Figure 7:
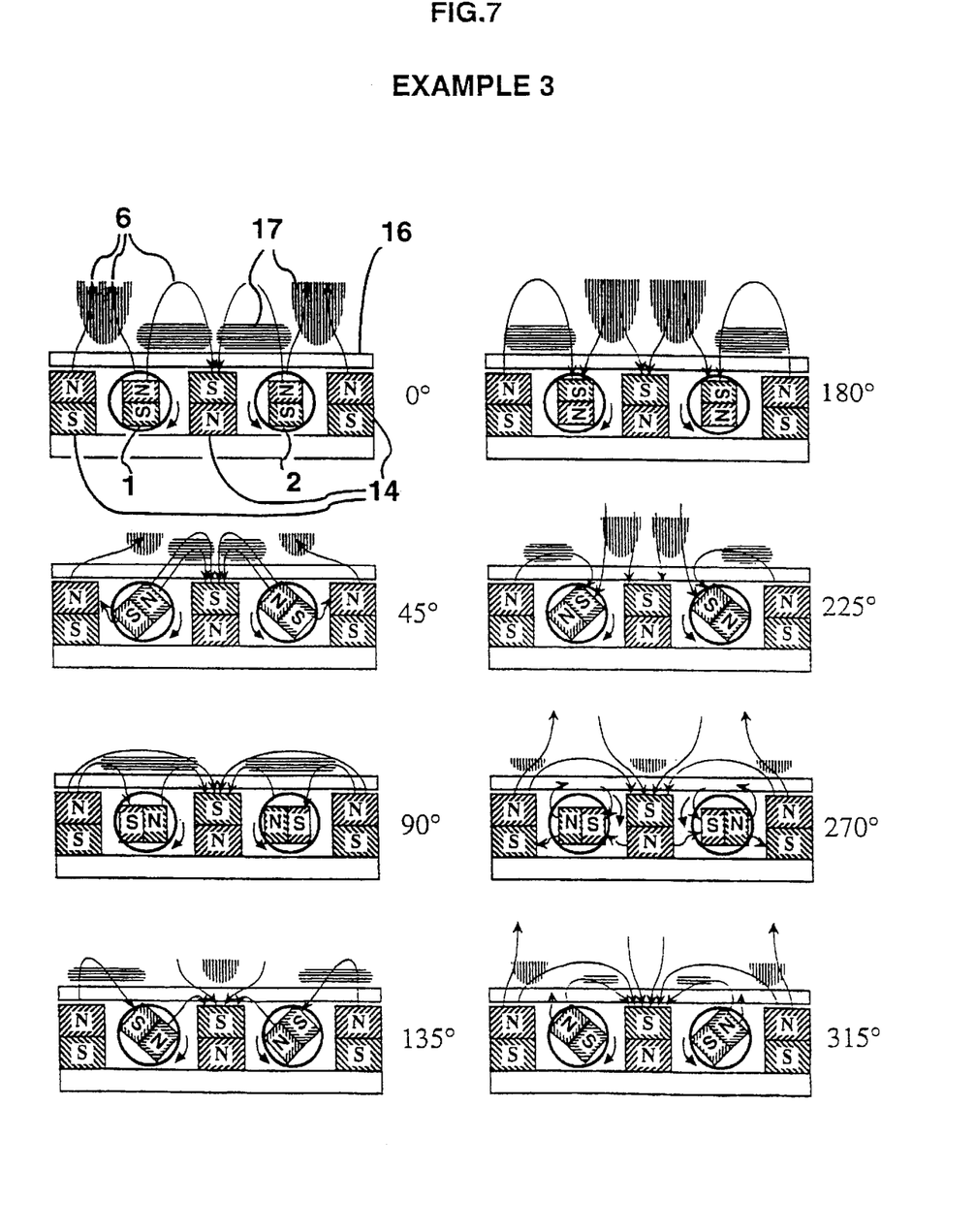
FIG. 7 shows an example of a plasma processing apparatus with rotary magnets according to a second embodiment of the present invention, for sequential 45° position changes from 0° to 315° of the rotary permanent magnet systems with respect to a stationary magnet system in a magnetron device, an effect on distribution of the magnetic flux lines and on distribution of a magnetron plasma generated in the apparatus shown in FIG. 2.

Referring to FIG. 7 a third example, related to a second embodiment of the plasma processing apparatus shown in FIG. 2, will be described. A schematic figure shows cross-sectional view of rotary permanent magnet systems 1 and 2 installed in combination with a magnetron device at different angular positions, in this case sequential 45° changes from 0° to 315°, with respect to a stationary magnet system 14 and to a magnetron target 16. Time variable angular positions of the rotary permanent magnet systems cause time variable shapes of the magnetic flux lines 6, which traverse a magnetron target 16. This results in a time dependent shape of the magnetron discharge 17. In this example the rotary permanent magnet systems are installed in a magnetron with balanced field setting and cause unbalancing in part of the stationary magnetic field. Motion of the rotary permanent magnet systems, for instance a simple rotation, creates time dependent shifts between balanced and unbalanced parts of the field. Consequently, magnetron erosion zone can be extended and both an unbalanced region and a balanced region of the magnetron discharge move periodically over the target.

Figure 8:
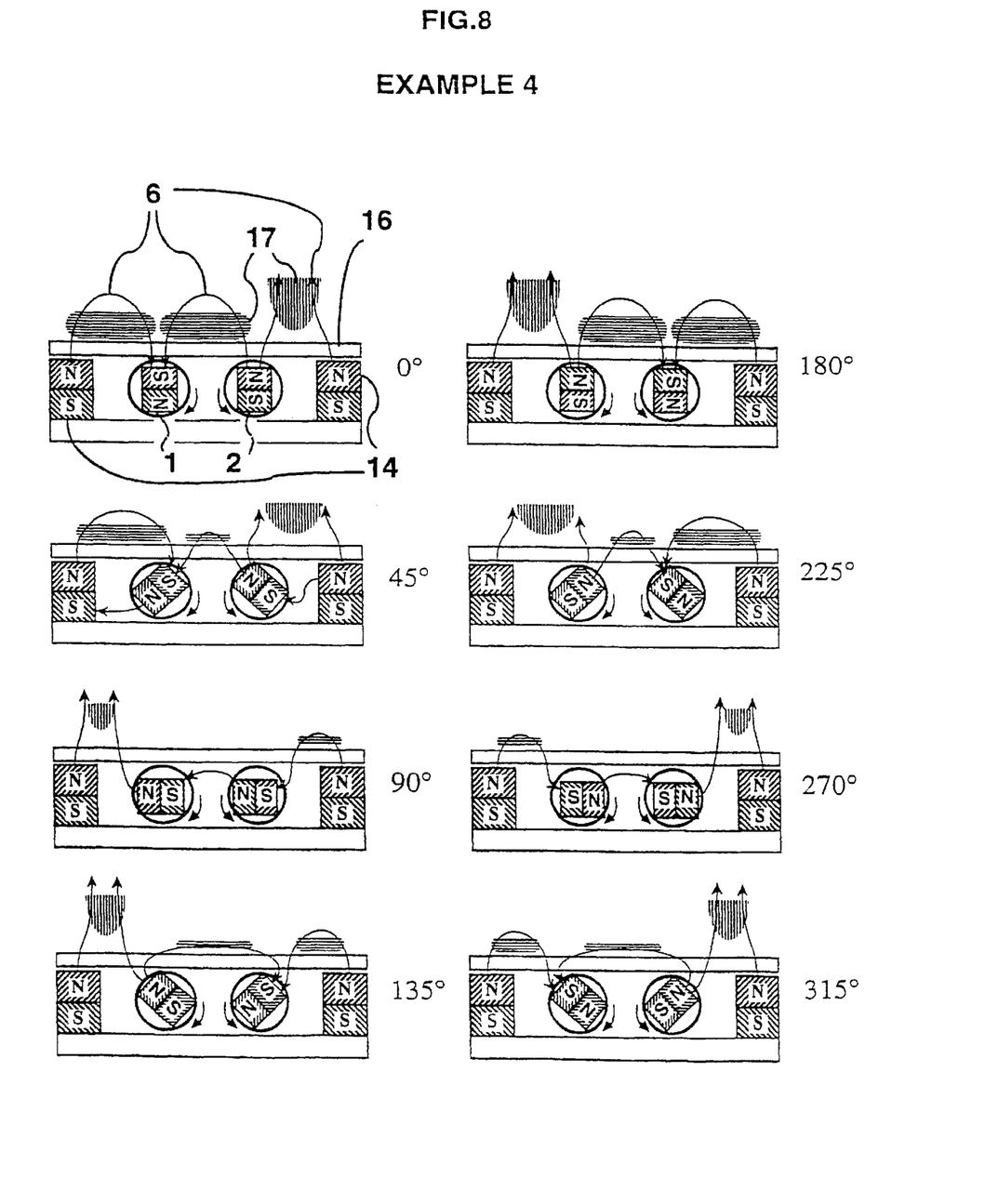
FIG. 8 shows an example of a plasma processing apparatus with rotary magnets according a second embodiment of the present invention, for sequential 45° position changes from 0° to 315° of the rotary permanent magnet system s with respect to a stationary magnet system in magnetron device, an effect on the distribution of generated in the apparatus shown in FIG. 2.

Referring to FIG. 8 a fourth example, related to a second embodiment of the plasma processing apparatus shown in FIG. 2, will be described. A schematic figure shows cross-sectional view of rotary permanent magnet systems 1 and 2 installed in combination with a magnetron diode device at different angular positions, in this case sequential 45° changes from 0° to 315°, with respect to a stationary magnet system 14 and to a magnetron target 16. Time variable angular positions in the rotary permanent magnet systems cause time variable shapes of the magnetic flux lines 6, which traverse the magnetron target 16. This results in a time dependent shape of the magnetron discharge 17. In this example the rotary permanent magnet systems are installed in a magnetron with unbalanced field setting and cause balancing of a portion of the stationary magnetic field. Motion of the rotary permanent magnet systems, for instance a simple rotation, creates time dependent shifts between closed and unbalanced portions of the field. Consequently, the magnetron erosion zone can be extended and an unbalanced region and balanced region of the magnetron discharge move periodically over the target.

Figure 9:
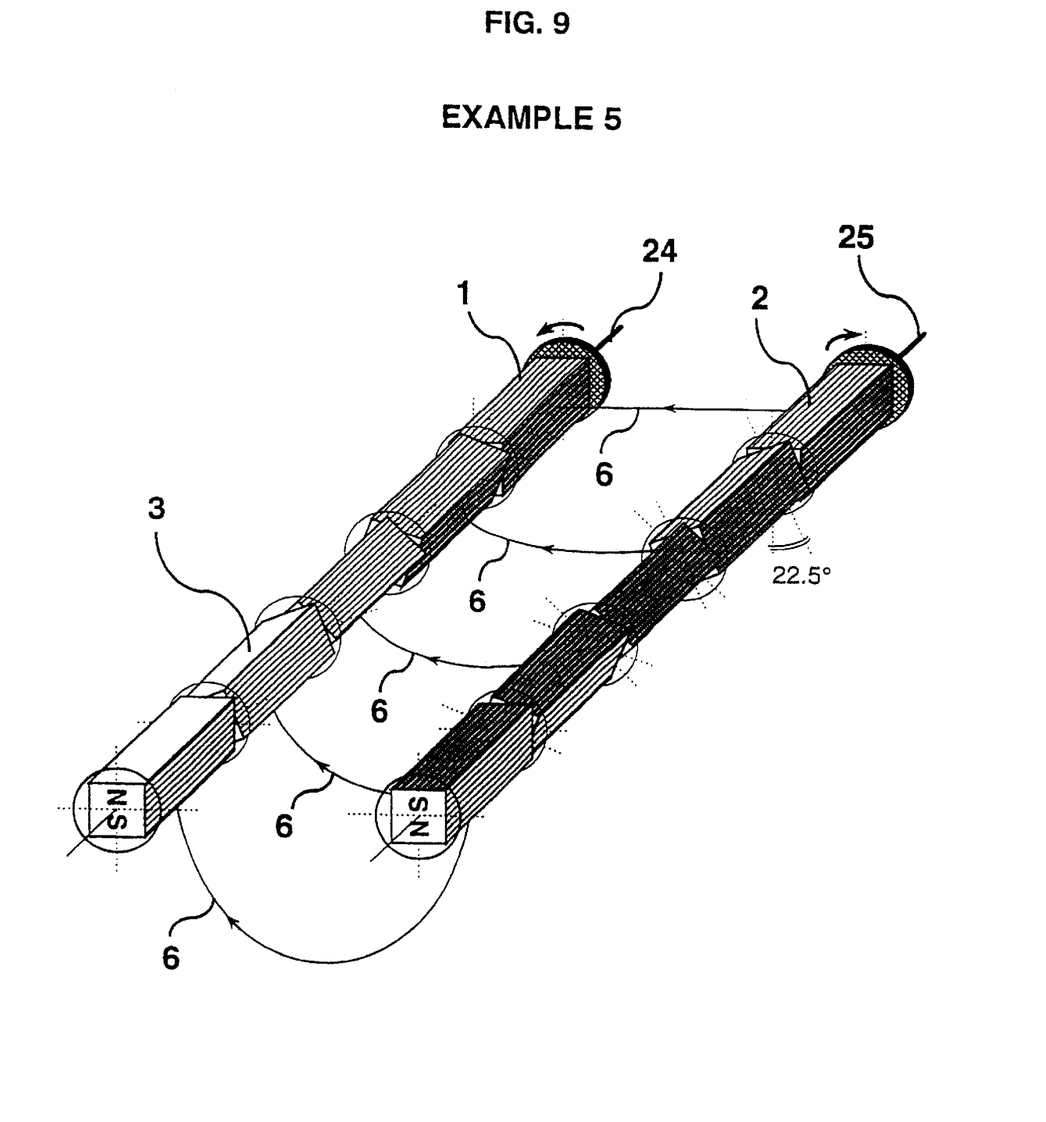
FIG. 9 is another example showing a simplified view of the rotary permanent magnet systems for plasma processing apparatus according to the present invention and an arrangement of individual permanent magnets.

Finally referring to FIG. 9 a fifth example, related to all embodiments of the plasma processing apparatus according to the invention, will be described. The figure shows an example of rotary permanent magnet systems 1 and 2 having individual permanent magnets 3 installed along axes of rotation 24 and 25 of the respective rotary permanent magnet systems 1 and 2. Individual magnets have a certain angle with respect to both neighboring magnets, for example 22.5°. This special arrangement of individual magnets leads to an axial dependence of shapes of the time variable magnetic flux lines 6. This kind of magnet arrangement can be favorably used for steering discharges in plasma processing devices. It results in more complex shapes of time dependent discharges, which can be, for instance, moved periodically along the hollow cathode outlet, or both along and across the magnetron target, etc.

The plasma processing apparatus with rotary magnets according to present invention has number of possible applications in plasma technology. The rotary permanent magnet systems allow to replace "rigid" concepts of processing discharges by time and space controlled active media. Characters of such media remind of pulsed type processing, however better stability and control is possible due to time controlled changes. A uniformity of the plasma processing will be improved too. In spite of a "perfect order", usually required from the processing plasma, a more natural "disorder" can be settled and controlled by special arrangements of the rotary permanent magnet systems. Such arrangements can be based, e.g., on planet type motions of the rotary permanent magnet systems, on different magnetic inductions of individual permanent magnets in the rotary permanent magnet systems, on simultaneous motions of all the magnets in the apparatus, etc. The rotary permanent magnet systems can be used in new types of plasma sources where time or space steering of the discharge is required.

What is claimed is:

1. A plasma processing apparatus, comprising means for generating a plasma discharge, and means for confining said plasma discharge in a magnetic field, particularly for arc discharge processing, wherein
   at least one pair of a first rotary permanent magnet system and a second rotary permanent magnet system comprising individual permanent magnets, and first and second permanent magnet systems being placed opposite to each other;
   said individual permanent magnets having a maximum magnetic induction of more than $10^{-1}$ Tesla;
   a driver system being disposed for driving a motion of said permanent magnets in said rotary permanent magnet systems;
   a basic plasma processing device comprising a linear arc discharge apparatus with at least one pair of hollow cathode plates placed in a magnetic field where stationary magnetic flux lines are either replaced or affected by time variable magnetic flux lines produced by said rotary permanent magnet systems for generation of a time dependent hollow cathode plasma;
   a control system comprising a sensor system and a feedback system connected to said driver system and disposed for controlling motion of said permanent magnets in said rotary permanent magnet systems with respect to charges of said time dependent hollow cathode plasma.

2. The plasma processing apparatus according to claim 1, wherein said basic plasma processing device comprises an active plasma in a reactor where said rotary permanent magnet systems are disposed outside said reactor to form said time variable magnetic flux lines for generating time dependent dense plasma regions.

3. The plasma processing apparatus according to claim 1, wherein said first and second rotary permanent magnet systems comprise individual permanent magnets having different maximum magnetic inductions and/or different directions of magnetic flux lines.

4. The plasma processing apparatus according to claim 1, wherein said driver system for controlling said motion of said permanent magnets in said first and second rotary permanent magnet systems enables driving of said rotary permanent magnet systems in a step-wise motion or a vibrational mode of operation around selected positions.

5. The plasma processing apparatus according to claim 1, wherein said basic plasma processing device comprises an active plasma in a reactor where said rotary permanent magnet systems are disposed inside said reactor to form said time variable magnetic flux lines for generating time dependent dense plasma regions.

6. The plasma processing apparatus according to claim 1, wherein said basic plama processing device comprises an active plasma in a reactor where said rotary permanent magnet systems are disposed inside and outside said reactor to form said time variable magnetic flux lines for generating time dependent dense plasma regions.

7. A plasma processing apparatus, comprising means for generating a plasma discharge, and means for confining said plasma discharge in a magnetic field, wherein
   at least one pair of a first rotary permanent magnet system and a second rotary permanent magnet system comprising individual permanent magnets, said first and second permanent magnet systems being placed opposite to each other;
   said individual permanent magnets having a maximum magnetic induction of more than $10^{-1}$ Tesla;
   a driver system being disposed for driving a motion of said permanent magnets in said rotary permanent magnet systems;
   a basic plasma processing device is used in combination with said rotary permanent magnet systems for forming time variable magnetic flux lines and for affecting a plasma produced by said basic plasma processing device;
   a control system comprising a sensor system and a feedback system connected to said driver system and disposed for controlling motion of said permanent magnets in said rotary permanent magnet systems with respect to changes in said plasma.

8. The plasma processing apparatus according to claim 7, wherein said first and second rotary permanent magnet systems comprise individual permanent magnets having different maximum magnetic inductions and/or different directions of magnetic flux lines.

9. The plasma processing apparatus according to claim 7, wherein said basic plasma processing device comprises an active plasma in a reactor where said rotary permanent magnet systems are disposed inside said reactor to form said time variable magnetic flux lines for generating time dependent dense plasma regions.

10. The plasma processing apparatus according to claim 7, wherein said basic plasma processing device comprises an active plasma in a reactor where said rotary permanent magnet systems are disposed inside and outside said reactor to form said time variable magnetic flux lines for generating time dependent dense plasma regions.

11. The plasma processing apparatus according to claim 7, wherein said basic plasma processing device comprises an active plasma in a reactor where said rotary permanent magnet systems are disposed outside said reactor to form said time variable magnetic flux lines for generating time dependent dense plasma regions.

12. The plasma processing apparatus according to claim 11, wherein said driver system for controlling said motion of said permanent magnets in said first and second rotary permanent magnet systems enables driving of said rotary permanent magnet systems in a step-wise motion or a vibrational mode of operation around selected positions.

13. The plasma processing apparatus accoridng to claim 7, wherein said basic plasma processing device comprises a magnetron device with a rotatable magnetron target, wherein said rotary permanent magnet systems are installed on a holder together with said stationary magnet system.

14. The plasma processing apparatus according to claim 13, wherein said basic plasma processing device comprises an active plasma in a reactor where said rotary permanent magnet systems are disposed outside said reactor to form said time variable magnetic flux lines for generating time dependent dense plasma regions.

15. The plasma processing apparatus according to claim 13, wherein said first and second rotary permanent magnet systems comprise individual permanent magnets having different maximum magnetic inductions and/or different directions of magnetic flux lines.

16. The plasma processing apparatus according to claim 13, wherein said driver system for controlling said motion of said permanent magnets in said first and second rotary permanent magnet systems enables driving of said rotary permanent magnet systems in a step-wise motion or a vibrational mode of operation around selected positions.

17. The plasma processing apparatus according to claim 13, wherein said basic plasma processing device comprises an active plasma in a reactor where said rotary permanent magnet systems are disposed inside said reactor to form said time variable magnetic flux lines for generating time dependent dense plasma regions.

18. The plasma processing apparatus according to claim 13, wherein said basic plasma processing device comprises an active plasma in a reactor where said rotary permanent magnet systems are disposed inside and outside said reactor to form said time variable magnetic flux lines for generating time dependent dense plasma regions.

19. The plasma processing apparatus according to claim 7, wherein said basic plasma processing device comprises a magnetron device with a stationary magnet system, wherein said rotary permanent magnet systems are disposed to form said time variable magnetic flux lines which traverse a magnetron target for generation of a time dependent magnetron plasma.

20. The plasma processing apparatus according to claim 19, wherein said basic plasma processing device comprises an active plasma in a reactor where said rotary permanent magnet systems are disposed outside said reactor to form said time variable magnetic flux lines for generating time dependent dense plasma regions.

21. The plasma processing apparatus according to claim 19, wherein said first and second rotary permanent magnet systems comprise individual permanent magnets having different maximum magnetic inductions and/or different directions of magnetic flux lines.

22. The plasma processing apparatus according to claim 19, wherein said driver system for controlling said motion of said permanent magnets in said first and second rotary permanent magnet systems enables driving of said rotary permanent magnet systems in a step-wise motion or a vibrational mode of operation around selected positions.

23. The plasma processing apparatus according to claim 19, wherein said basic plasma processing device comprises an active plasma in a reactor where said rotary permanent magnet systems are disposed inside said reactor to form said time variable magnetic flux lines for generating time dependent dense plasma regions.

24. The plasma processing apparatus according to claim 19, wherein said basic plasma processing device comprises an active plasma in a reactor where said rotary permanent magnet systems are disposed inside and outside said reactor to form said time variable magnetic flux line for generating time dependent dense plasma regions.

25. The plasma processing apparatus according to claim 13, wherein said basic plasma processing device comprises a magnetron device with a rotatable magnetron target, wherein said rotary permanent magnet systems are installed on a holder together with said stationary magnet system.

26. The plasma processing apparatus according to claim 25, wherein said first and second rotary permanent magnet systems comprise individual permanent magnets having different maximum magnetic inductions and/or different directions of magnetic flux lines.

27. The plasma processing apparatus according to claim 25, wherein said driver system for controlling said motion of said permanent magnets in said first and second rotary permanent magnet systems enables driving of said rotary permanent magnet systems in a step-wise motion or a vibrational mode of operation around selected positions.

28. The plasma processing apparatus according to claim 7, wherein said driver system for controlling said motion of said permanent magnets in said first and second rotary permanent magnet systems enables driving of said rotary permanent magnet systems in a step-wise motion or a vibrational mode of operation around selected positions.

* * * * *